PRINTED CIRCUIT BOARD ASSEMBLY

Filed Feb. 12, 1962

INVENTORS.
ALEX JUST
PAUL A. MAXIMOFF
RICHARD T. KRAUSE
BY
Byron, Hume, Groen & Clement
ATTORNEYS.

3,136,591
Patented June 9, 1964

3,136,591

PRINTED CIRCUIT BOARD ASSEMBLY

Alex Just, River Forest, Paul A. Maximoff, Barrington, and Richard T. Krause, Barrington Hills, Ill., assignors to Malco Manufacturing Company, Chicago, Ill., a partnership Filed Feb. 12, 1962, Ser. No. 172,462
3 Claims. (Cl. 339—17)

This invention relates in general to electrical terminals and more particularly to an electrical terminal arrangement adapted specifically for printed circuitry and the like.

Printed circuitry has come into wide-spread use in the electrical industry in recent years. In its most common form, the printed circuit concept is embodied in a printed circuit board of one type or other. These boards are conventionally formed of an insulating material and incorporate the circuitry desired in the form of strips of highly conductive material such as a copper alloy or the like inlaid or imprinted on the surface of the insulating material. Miniature electrical components including, for example, capacitors or the like are also frequently incorporated in a well known manner in such circuitry.

In operative relationship, of course, a printed circuit is normally connected into a basic electrical circuit or unit of which the printed circuit itself forms a component. This connection is frequently made by lead wires or the like soldered into both the printed circuit and the basic circuit, for example. Of course, it will be seen that such a construction does not facilitate expeditious connection of a printed circuit board into a basic circuit.

A variety of printed circuit connectors have been developed to date, of course, as is evidenced by the Kennedy patent, No. 2,937,357, for example. However, these developments have not begun to solve the problem of providing a guaranteed tight electrical connection in a minimum of space with an inexpensive unit. In addition, they are almost unanimously constructed in a manner which is less than sturdy and in many instances requires a substantial amount of valuable space in the basic circuitry, for example.

It is an object of this invention to provide a new and improved electrical terminal arrangement for use with printed circuitry and the like.

It is another object to provide an electrical terminal arrangement which markedly increases the usefulness of printed circuitry.

It is still another object to provide a terminal arrangement of facilitating the plug-in connection of component printed circuitry in a basic circuit or unit, for example.

It is yet another object to provide a printed circuit terminal connector construction which facilitates expeditious and simple insertion and removal of the printed circuitry from appropriate basic electrical circuits or units or the like.

It is still a further object to provide an electrical terminal arrangement of the aforedescribed character which is compact in construction and occupies a minimum of vital space when associated with appropriate electrical equipment or the like.

It is another object to provide such an electrical terminal arrangement which is sturdy in construction and simple and inexpensive to manufacture.

The above and other objects are realized in accordance with the present invention by providing a new and improved terminal connector arrangement for printed circuitry. Briefly, the invention contemplates a unique combination of a printed circuit board orientated in a predetermined manner and adapted for use in plug-in type circuitry by means of a pressed-in type terminal connector assembly. The pressed-in type terminal connector assembly is adapted to be mated with a bank of corresponding terminals in a terminal connector board. The terminal connector board might be wired as desired to interconnect its associated terminal connectors with suitable basic circuits, units or other electrical equipment. In this manner, of course, the printed circuitry is readily and simply incorporated into any chosen basic circuit, for example.

The invention, both as to its organization and method of operation, taken with further objects and advantages thereof, will best be understood by reference to the following description taken in connection with the accompanying drawing, in which.

Figure 1:
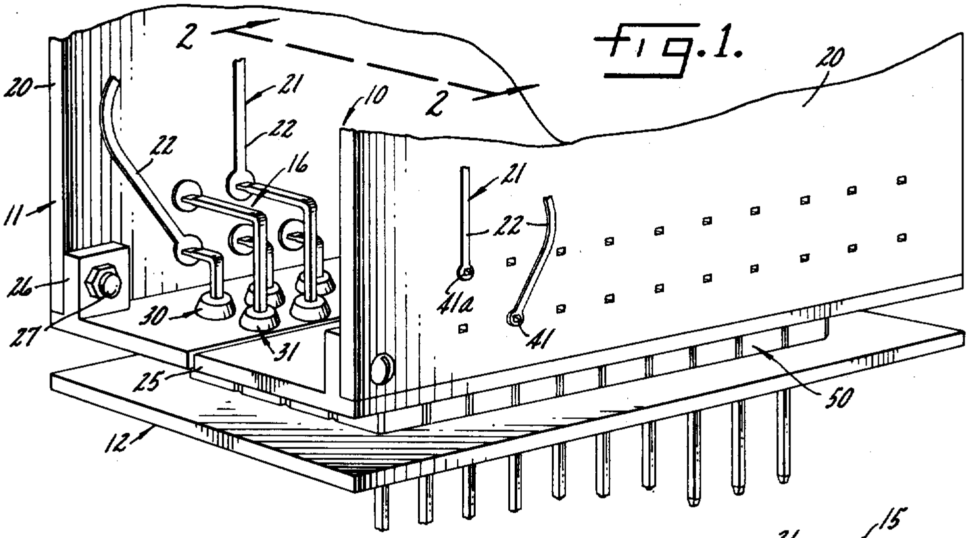
FIGURE 1 is a fragmentary perspective view of the printed circuitry and associated terminal connector arrangement embodying the features of this invention.

Referring now to the drawings and particularly to FIGURE 1, a pair of printed circuit terminal connector assemblies embodying the features of this invention are shown generally at 10 and 11. Each of the assemblies 10 and 11 is plugged into a terminal board assembly, seen generally at 12, of well known construction. The printed circuit assemblies 10 and 11 are specifically designed to adapt printed circuitry for plug-in type usage and their construction is unique to that end.

The printed circuit terminal connector assemblies 10 and 11 are identical in construction, though they are shown mounted in opposed relationship. In view of the fact that the construction and utilization of each unit is substantially the same, a detailed description of one will suffice to facilitate a clear understanding of both.

The printed circuit terminal connector assembly 10 embodying the features of this invention includes a printed circuit board sub-assembly, seen generally at 15, and a terminal connector sub-assembly, seen generally at 16. The printed circuit board sub-assembly 15 and the terminal connector sub-assembly 16 cooperate to provide electrical contacts which facilitate plugging the circuitry into the terminal board assembly 12 with the utilization of a minimum of space and in a rigid, self-supporting construction.

Figures 2, 3:
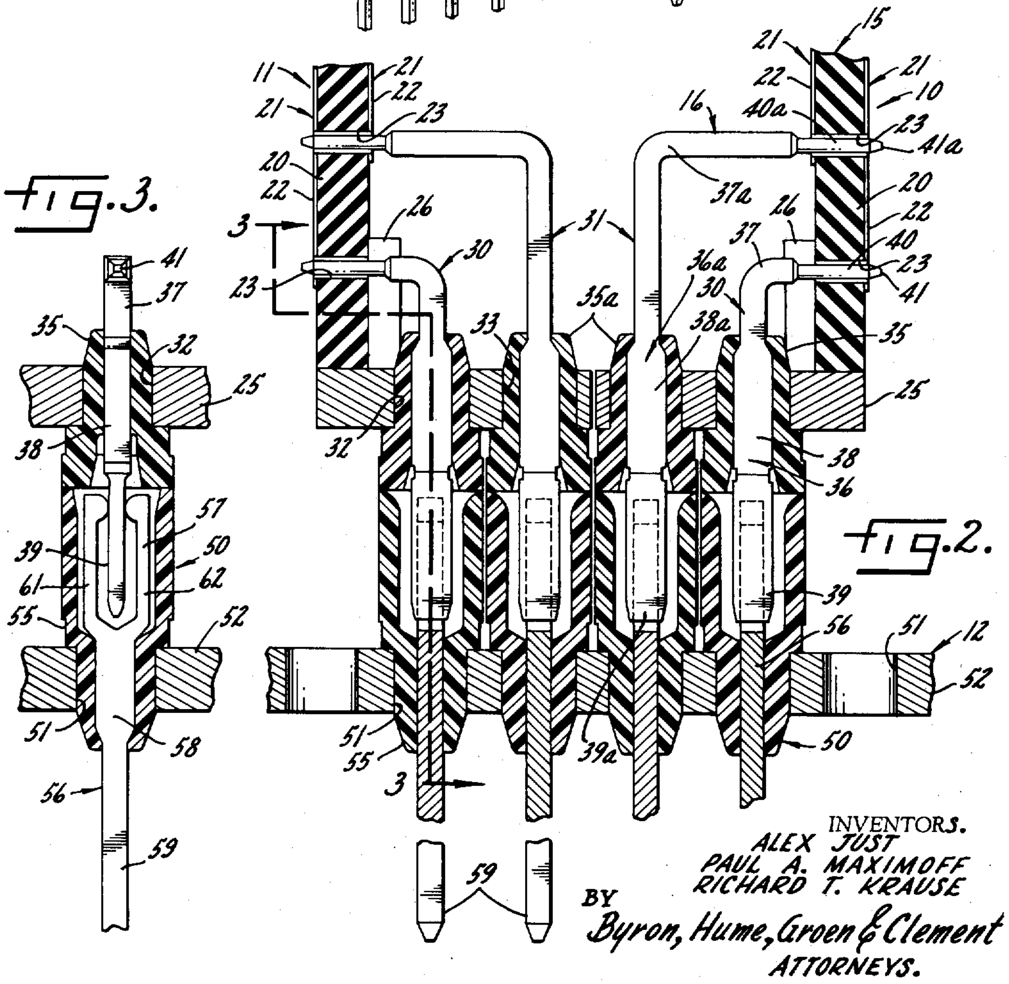
FIGURE 2 is a sectional view taken along line 2—2 of FIGURE 1.
FIGURE 3 is a fragmentary sectional view taken along line 3—3 of FIGURE 2, with parts broken away.

Referring now to FIGURE 2, the printed circuit board sub-assembly 15 comprises a vertically extending board 20 composed of an insulating fiber or plastic material or the like of any well known composition. The board 20 has appropriately disposed printed circuitry on both of its surfaces, portions of which are illustrated generally at 21. The circuitry is composed of any conductive material, such as copper. The printed circuitry 21 might be laid out in any conventional arrangement and the details of this arrangement are not germane to the details of this invention. Suffice it to say that the various terminals of the printed conduits 22 in the printed circuitry 21 are defined by apertures 23 extending through the board 20 and the conductive material of which the printed circuit conduits 22 are made. The terminal apertures 23 are adapted to connect with the terminal connector sub-assembly 16, which in turn completes a plug-in connection with the terminal board assembly 12.

It should be noted, of course, that the circuit board 20 need not be limited to one utilizing printed circuitry since the board might utilize any conceivable type of conductors for forming the electrical circuitry. For example, the circuit board 20 may be of the same type as the terminal board assembly 12.

The terminal connector sub-assembly 16 includes a base plate 25 upon which the printed circuit board 20 is mounted. The base plate 25 might be formed of aluminum, although numerous other materials could be utilized.

As seen in FIGURES 1 and 2, ears 26 extend upwardly from the base plate 25 and conventional nut and bolt fasteners or rivets 27 secure the printed circuit board thereto in perpendicular relationship to the terminal board 25.

The terminal connector sub-assembly 16 further includes a longitudinally aligned inner row of male terminal connectors 30 and a longitudinally extending outer row of male terminal connectors 31. Each of the inner row of male terminal connectors 30 is mounted in a corresponding aperture 32 in the plate 25 and each of the outer row of male terminal connectors 31 is mounted in a corresponding aperture 33 in the plate.

Again referring specifically to FIGURE 2, each of the male terminal connectors 30 in the inner row includes a bushing 35 and a male terminal pin 36. Each pin 36 is preferably formed of a highly conductive material such as half-hard brass, and each bushing is formed of a softer material which might be nylon, or the like. Each male terminal pin 36 has an upwardly extending angulated shank 37, a locking shank portion 38 and a depending male blade 39. A self-locking fit is established between a corresponding aperture 32 in the base plate 25, a bushing 35 and the locking shank portion 38 of each pin 36. This self-locking fit establishes the terminal pins 36 in a solid mounting in the terminal board 25.

The details of such a mounting are discussed fully in the Maximoff et al. patent entitled "Self-Locking Terminal," Patent No. 2,995,617, issued August 8, 1961 and assigned to the same assignee as the present application showing a terminal pin also the Just et al. Patent No. 3,086,074, issued April 16, 1963, these patents showing a pin socket for terminal base boards. These details form no part of the present invention, however. Consequently, a detailed discussion of the self-locking fit construction is not thought to be necessary.

The end portion 40 of each angulated shank 37 in the inner row of male terminal connectors 30 extends generally parallel to the base plate 25 and is reduced in size, as also seen in FIGURE 2. The outermost extremity 41 of this reduced portion 40 is tapered and extends through a corresponding terminal aperture 23 forming the terminus of a corresponding printed conduit 22 in the printed circuitry 21 on the printed circuit board 20. The tapered extremity 41 of this reduced portion 40 of the shank 37 is preferably soldered in the corresponding terminal aperture 23 to provide a good electrical connection between a corresponding conduit 22 in the printed circuitry and the appropriate terminal pin 36. The soldering might be accomplished by a dip soldering process, for example, or by other soldering means or the like.

The outer row of male terminal connectors 31 includes a bushing **35*a* and a male terminal pin 36*a*. Each male terminal connector 31 is substantially identical in construction to each male terminal connector 30 with the exception that the upwardly extending angulated shank 37*a* of each pin 36*a* is substantially longer than a corresponding angulated shank 37 associated with a male terminal pin 36**.

Each male terminal pin **36*a* includes, in addition to an angulated shank 37*a*, a locking shank portion 38*a*, and a depending male blade 39*a*. A self-locking fit is preferably established between a corresponding aperture 33 in the base plate 25, a bushing 35*a*, and the locking shank portion 38*a* of each pin 36*a*. This relationship is identical to that referred to above in relation to the inner row of male terminal connectors 30** and is discussed in detail in the aforementioned Patent No. 2,995,617.

As is readily seen in FIGURE 2, the end portion **40*a* of the angulated shank 37*a* of each pin 36*a* in the outer row of male terminal connectors 31 extends generally parallel to the base plate 25 above the corresponding end portion 40 of the angulated shank 37 of each pin 36 in the inner row of male terminal connectors 30. Each end portion 40*a* has a reduced dimension and is tapered at its outermost extremity 41*a*. The outer extremity 41*a* of each shank 37*a* extends through an appropriate terminal aperture 23 in the printed circuit board 20 in a manner which has been hereinbefore discussed. The tapered extremities 41*a* are preferably soldered in corresponding terminal apertures 23 to provide good electrical connections between corresponding conduits 22 in the printed circuitry 21 and the male terminal pins 36*a***.

The male blades 39 and **39*a* forming the depending free ends of the male terminal pins 36 and 36*a*, respectively, are identical in construction, as has been pointed out. They are adapted to plug into female terminal connectors 50 in the terminal board assembly 12. The female terminal connectors 50 are mounted in corresponding apertures 51 in the base terminal board 52 which might be formed of aluminum, for example. As best seen in FIGURE 3, each terminal connector 50 includes a bushing 55 seated in a corresponding aperture 51 in the terminal board 52 and a female terminal pin 56 extending through the bushing 55. Each of the female terminal pins 56 is adapted to receive a corresponding male blade 39 or 39*a*** and additionally adapted to be connected to a basic circuit, for example.

Each female terminal pin 56 includes a fork portion 57 for receiving a corresponding male blade 39 or **39*a*, a self-locking shank portion 58, and a wire wrap shank 59. The use of a wire wrap shank is merely exemplary of the type of terminal pin which might be utilized, however, For example, in the alternative, a crimp connector might form the lower terminus of the female terminal pin 56. Each terminal pin 56 is seated in a bushing 55 in a corresponding aperture 51 in the base terminal board 52. A self-locking fit similar to that disclosed in the aforementioned patent, No. 2,995,617 and referred to above, is established between each female terminal pin, a bushing 55 and a corresponding aperture 51 in the terminal board 52**.

The fork portion 57 of each female terminal pin 56 includes a pair of tines 61 and 62 which extend in generally parallel relationship. The tines 61 and 62 are adapted to bracket and electrically contact a corresponding male blade 39 or **39*a* forming the lower ends of an appropriate male terminal pin 36 or 36*a* in the terminal connector sub-assembly 16. The wire wrap shank 59 of each female terminal pin 56** is, of course, properly connected with electrical leads to appropriate basic circuitry, systems, or networks of electrical equipment.

As will now be readily seen, a printed circuit terminal connector assembly 10 is connected into a terminal board assembly 12 in predetermined relationship by seating the male terminal blades 39 and **39*a* of the terminal connector sub-assembly 16 in the fork portions 57 of corresponding female terminal pins 56 associated with the terminal board assembly 12. In this manner, the printed circuitry 21** is easily and expeditiously connected in predetermined relationship into an appropriate basic circuit or electrical unit for which it performs a specific function.

The printed circuit terminal connector assembly 11 is identical in construction to the printed circuit terminal connector assembly 10, as is its relationship with the terminal board assembly 12. Consequently, its components are identified by reference numerals corresponding to their counterparts in the printed circuit terminal connector assembly 10. It will be seen, however, that the printed circuit terminal connector assembly 11 is mounted in opposed relationship to that of the printed circuit terminal connector assembly 10 in FIGURE 2. This opposed, side by side relationship, in conjunction with the compact and unique construction of the printed circuit terminal connector assemblies 10 and 11, requires a minimum of vital space in electrical equipment in which the assemblies are incorporated. Consequently, a great number of printed circuit components can be set up in a smaller space than heretofore found possible. For example, notice in FIGURE 2 that each printed circuit terminal assembly occupies space covering only approximately three rows of apertures 51 in the terminal board assembly 12.

In addition, removal of the printed circuit terminal connector assemblies 10 and 11 from connection with the terminal connectors 50 associated with the terminal board assembly 12 is readily facilitated. The printed circuit terminal connector assemblies 10 and 11 can readily be connected into another basic circuit in the same terminal board assembly 12 or in another terminal board assembly, for example. The need for laborious soldering of the various connections between the printed circuitry and the terminals of the basic circuit or electrical unit, for example, is eliminated.

Obviously, the printed circuit terminal connector assemblies 10 and 11 can be plugged in and removed from a terminal board assembly 12 while the wire wrap shanks 59 associated with the terminal board assembly 12 can readily be wrapped and unwrapped as is desired to change the wiring of the basic circuitry without varying the construction of the printed circuit terminal connector assemblies 10 and 11.

It will be seen that an electrical terminal arrangement which especially adapts itself for use with printed circuitry and is easy to insert and remove from basic circuits, for example, has been described and illustrated. The construction embodying the features of this invention facilitates the alternation and modification of basic circuits without physically altering the structure of printed circuitry or printed circuit boards. In this light, the printed circuit terminal connector arrangements can readily be plugged into or removed from the basic circuits and the wire wrap construction of the terminal board assembly permits varying the basic circuit wiring also without soldering or the like.

The printed circuit connector arrangements 10 and 11 which have been described are simple in construction and inexpensive to manufacture. They can be used efficiently and economically and consequently are highly desirable in the complicated electronic systems widely used in the firing control units for missiles, for example.

While an embodiment described herein is at present considered to be preferred, it is understood that various modifications and improvements might be made therein, and it is intended to cover in the appended claims all such modifications and improvements as fall within the true spirit and scope of the invention.

What is desired to be claimed and secured by Letters Patent of the United States is:

1. A terminal connector assembly, comprising; a metallic base plate, a printed circuit board mounted on said base plate and extending substantially perpendicular thereto, said circuit board having electrical circuitry thereon, a plurality of apertures formed in said metallic base plate and disposed in at least one row generally parallel to said circuit board, a terminal connector mounted in each of said apertures, each of said terminal connectors including a metallic terminal pin extending through a sleeve formed of relatively soft insulating material and seated in a corresopnding aperture, each of said pins having one portion at one end extending generally parallel to said base plate and forming an electrical connection with said circuitry, and another portion at the opposite end for electrical connection into electrical means of which the printed circuitry forms a component.

2. The terminal connector assembly of claim 1 further characterized by and including a plurality of rows of terminal connectors mounted in said metal base plate and extending generally parallel to said board, said one portion of each of said terminal pins including a section reduced in size and extending through an aperture in said printed circuit board.

3. The terminal connector assembly of claim 1 further characterized in that each of said terminal pins extends through a corresponding sleeve of relatively soft insulating material in an interference fit, so as to firmly seat the terminal connector in the metal base plate.

References Cited in the file of this patent

UNITED STATES PATENTS

| | | |
|---|---|---|
| 2,993,187 | Bisbing et al. | July 18, 1961 |
| 2,995,617 | Maximoff et al. | Aug. 8, 1961 |
| 3,008,113 | Johnson | Nov. 7, 1961 |

OTHER REFERENCES

Lawson, A. A.: "Electrical Mfg.," October 1954, page 135.

UNITED STATES PATENT OFFICE

CERTIFICATE OF CORRECTION

Patent No. 3,136,591 June 9, 1964

Alex Just et al.

It is hereby certified that error appears in the above numbered patent requiring correction and that the said Letters Patent should read as corrected below.

Column 3, line 30, after "application" insert a period; lines 31 to 33, strike out "showing a terminal pin also the Just et al. Patent No. 3,086,074, issued April 16, 1963, these patents showing a pin socket for terminal base boards." ; column 5, line 28, for "alternation" read -- alteration --; column 6, line 16, for "corresopnding" read -- corresponding --.

Signed and sealed this 1st day of December 1964.

(SEAL)
Attest:

ERNEST W. SWIDER
Attesting Officer

EDWARD J. BRENNER
Commissioner of Patents

Dedication 3,136,591.—*Alex Just*, River Forest, *Paul A. Maximoff*, Barrington, and *Richard T. Krause*, Barrington Hill, Ill. PRINTED CIRCUIT BOARD ASSEMBLY. Patent dated June 9, 1964. Dedication filed Feb. 10, 1969, by the assignee, *Malco Manufacturing Company, Inc.*

Hereby dedicates to the people of the United States the terminal portion of the term of said patent subsequent to Sept. 14, 1966.

[*Official Gazette May 27, 1969.*]